(12) United States Patent
Ostrem

(10) Patent No.: US 6,720,898 B1
(45) Date of Patent: Apr. 13, 2004

(54) CURRENT SOURCE ARRAY FOR HIGH SPEED, HIGH RESOLUTION CURRENT STEERING DACS

(75) Inventor: Geir Sigurd Ostrem, Colorado Springs, CO (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/410,746

(22) Filed: Apr. 10, 2003

(51) Int. Cl.$^7$ ................................................ H03M 1/66
(52) U.S. Cl. ...................... 341/144; 341/145; 341/153
(58) Field of Search ................................. 341/144, 145, 341/154, 153, 133, 136, 118

(56) References Cited

U.S. PATENT DOCUMENTS

| | | | |
|---|---|---|---|
| 5,327,134 A | * 7/1994 | Nakamura et al. | ........... 341/144 |
| 5,568,145 A | 10/1996 | Reynolds | |
| 5,929,798 A | * 7/1999 | Baek | ........................ 341/153 |
| 5,949,362 A | * 9/1999 | Tesch et al. | ................ 341/144 |
| 6,317,066 B1 | * 11/2001 | Chiang | ....................... 341/144 |
| 6,433,721 B2 | * 8/2002 | Katada | ........................ 341/144 |
| 6,452,527 B2 | * 9/2002 | Takeya et al. | ............... 341/144 |

OTHER PUBLICATIONS

McCreary, James L. et al., "All–MOS Charge Redistribution Analog–to–Digital Conversion Techniques—Part 1", IEEE Journal of Solid–State Circuits, Dec. 1975, pp. 371–379, vol. SC–10, No. 6.

Vittoz, Eric A., "The Design of High–Performance Analog Circuits on Digital CMOS Chips", IEEE Journal of Solid–State Circuits, Jun. 1985, pp. 657–665, vol. SC–20, No. 3.
Allen, Phillip E. et al., "CMOS Analog Circuit Design", 1987, pp. 327–333, University Press.
Bastiaansen, Cornelis A. A. et al., "A 10–b 40–MHz 0.8–$\mu$m CMOS Current–Output D/A Converter", IEEE Journal of Solid–State Circuits, Jul. 1991, pp. 917–921, vol. 26.
Gray, Paul R. et al., Analysis and Design of Analog Integrated Circuits, Jul. 1992, John Wiley & Sons, Inc.
Hastings, Alan, "The Art of Analog", 2001, pp. 435–439, Prentice Hall.

* cited by examiner

Primary Examiner—Brian Young
Assistant Examiner—John Nguyen
(74) Attorney, Agent, or Firm—Blakely, Sokoloff, Taylor & Zafman LLP

(57) ABSTRACT

Current source arrays having a plurality of current sources arranged in an array of columns and rows are disclosed. The outputs of the current sources in even rows of the first column of an array are connected to the output of a current source in each of the other columns located along a first diagonal through the array from the respective current source in the first column. Also the outputs of the current sources in odd rows of the first column of the array are each connected to the output of a current source in each of the other columns located along a second diagonal through the array from the respective current source in the first column, the second diagonals being in an opposite diagonal direction from the first diagonals. When used in a current steering thermometer DAC, preferably but not necessarily, the current sources for the least significant bits are located on a main diagonal of the array.

14 Claims, 4 Drawing Sheets

CURRENT SOURCE LAYOUT FOR COMPENSATION FOR FIRST AND SECOND ORDER GRADIENTS

| | | | | | | | | | | | | | | | | |
|---|---|---|---|---|---|---|---|---|---|---|---|---|---|---|---|---|
|16 |16|15|2 |13|4 |11|6 |9 |8 |7 |10|5 |12|3 |14|1 |
|   |15|16|13|2 |11|4 |9 |6 |7 |8 |5 |10|3 |12|1 |14|
|14 |14|13|16|11|2 |9 |4 |7 |6 |5 |8 |3 |10|1 |12|15|
|   |13|14|11|16|9 |2 |7 |4 |5 |6 |3 |8 |1 |10|15|12|
|12 |12|11|14|9 |16|7 |2 |5 |4 |3 |6 |1 |8 |15|10|13|
|   |11|12|9 |14|7 |16|5 |2 |3 |4 |1 |6 |15|8 |13|10|
|10 |10|9 |12|7 |14|5 |16|3 |2 |1 |4 |15|6 |13|8 |11|
|   |9 |10|7 |12|5 |14|3 |16|1 |2 |15|4 |13|6 |11|8 |
|8  |8 |7 |10|5 |12|3 |14|1 |16|15|2 |13|4 |11|6 |9 |
|   |7 |8 |5 |10|3 |12|1 |14|15|16|13|2 |11|4 |9 |6 |
|6  |6 |5 |8 |3 |10|1 |12|15|14|13|16|11|2 |9 |4 |7 |
|   |5 |6 |3 |8 |1 |10|15|12|13|14|11|16|9 |2 |7 |4 |
|4  |4 |3 |6 |1 |8 |15|10|13|12|11|14|9 |16|7 |2 |5 |
|   |3 |4 |1 |6 |15|8 |13|10|11|12|9 |14|7 |16|5 |2 |
|2  |2 |1 |4 |15|6 |13|8 |11|10|9 |12|7 |14|5 |16|3 |
|   |1 |2 |15|4 |13|6 |11|8 |9 |10|7 |12|5 |14|3 |16|
|   |  |2 |  |4 |  |6 |  |8 |  |10|  |12|  |14|  |16|

FIG. 8

CURRENT SOURCE ARRAY FOR HIGH SPEED, HIGH RESOLUTION CURRENT STEERING DACS

BACKGROUND OF THE INVENTION

1. Field of the Invention

The present invention relates to the field of current source arrays for use in thermometer coded current steering digital to analog converters and the like.

2. Prior Art

Arrays of equal value current sources are used to define the most significant bits in high-speed digital to analog converters (DACs). Digital to analog conversion is achieved by steering these currents to one of two analog outputs, typically terminated in resistors. Accurate matching between these current sources, typically implemented with MOS transistors, is essential to achieve a DAC that is highly linear without being trimmed or calibrated.

The individual current sources of a DAC are mismatched for a number of reasons. Random fluctuations in threshold voltage and charge carrier mobility causes a random mismatch between the current sources. Gradients in oxide thickness, mechanical stress and resistive voltage drops in supply lines cause linear, parabolic and higher order gradients across the current source array, resulting in a nonlinear DAC transfer function.

Therefore, the layout of thermometer coded most significant bits (MSBs) for a current steering DAC must be done with utmost care to avoid systematic errors due to linear and higher order process gradients. It is also important that the layout be practical and correct in other respects as outlined below:

1. The amount of routing must be the same for all current sources, such that the output capacitance is the same for all current sources.
2. The amount of routing required to implement the layout must not be excessive, such that the (overhead) output capacitance caused by routing is low.
3. The layout must compensate for linear and parabolic process gradients.
4. A possibility to integrate the LSB current sources in the layout for the MSB sources is valuable.

It is useful to be able to access the outputs of the array from at least two sides to be able to implement trim or calibration current sources on one side and DAC switches on the other side, as illustrated in FIG. 1.

The number of current sources to be laid out is nominally $2^N-1$, where N is the number of thermometer coded most significant bits (MSBs) in the DAC. In order to compensate for process gradients, each source is normally split into m smaller unit current sources, and these are distributed into an array of $2^N \times m$ unit sources in such a manner that process gradients are compensated. One way of doing this is by distributing the current sources evenly in both the vertical and horizontal directions, typically with $2^N$ rows and $2^N$ columns ($m=2^N$). An obvious example of such a layout is described in U.S. Pat. No. 5,568,145. An example layout is shown in FIG. 2. The current sources are numbered from 1 to 16. In this case, each current source is split into 16 unit current sources, giving a total current source array size of 256 sources.

The output routing is illustrated in FIG. 3 for an example array of 8 current sources. The layout has mostly local interconnect, which keeps the output capacitance low. To match the output capacitances of all sources accurately, it is necessary to add one set of interconnect to the right or left side of the array. The patent also describes integrating the LSBs of the DAC in a column or a row located in the center of the array, as shown in FIG. 3.

The technique of the foregoing patent cancels first and second order gradients in horizontal and vertical directions, but does not cancel second order gradients due to parabolic gradients in other directions (rotated parabolic gradients). The rotated parabolic gradients in such a layout cause a parabolic error across the current source array. This will typically cause an "S-shaped" integral nonlinearity error, and hence a third order harmonic distortion in the output of the DAC.

BRIEF SUMMARY OF THE INVENTION

Current source arrays having a plurality of current sources arranged in an array of columns and rows are disclosed. The outputs of the current sources in even rows of the first column of an array are connected to the output of a current source in each of the other columns located along a first diagonal through the array from the respective current source in the first column. Also the outputs of the current sources in odd rows of the first column of the array are each connected to the output of a current source in each of the other columns located along a second diagonal through the array from the respective current source in the first column, the second diagonals being in an opposite diagonal direction from the first diagonals. When used in a current steering thermometer DAC, preferably but not necessarily, the current sources for the least significant bits are located on a main diagonal of the array.

BRIEF DESCRIPTION OF THE DRAWINGS

FIG. 8 is a diagram showing that every current is available at the top and bottom of an array in accordance with the present invention.

DESCRIPTION OF THE PREFERRED EMBODIMENTS

The present invention provides a current source layout that has the same cancellation of first and second order gradients in horizontal and vertical directions as in the prior art. In addition, however, the XY-terms in the proposed layout will not cause a parabolic error, but an error that is alternating between positive and negative values. This should produce less third harmonic distortion than the layout described in the prior art patent hereinbefore referred to.

Figures 1, 2:
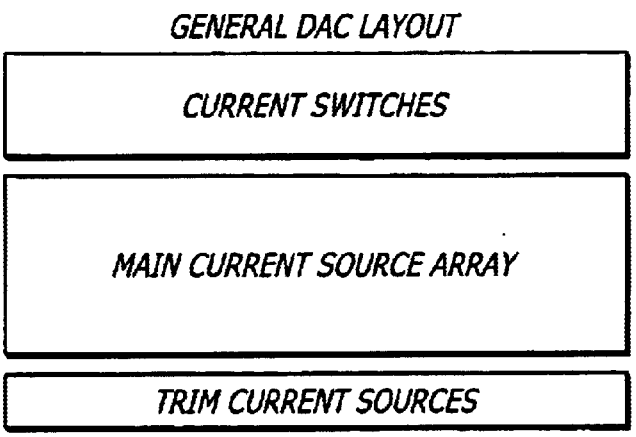
FIG. 1 is a diagram illustrating how the array must be accessed from two sides to be able to implement trim current sources on one side and DAC switches on the other side.
FIG. 2 illustrates a layout of current sources in a prior art current source array.
Figures 3, 4:
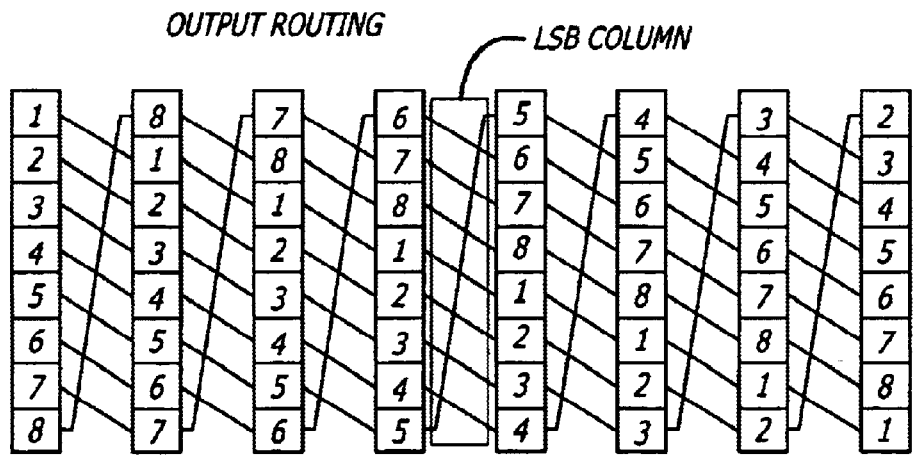
FIG. 3 illustrates prior art output routing in an example array of 8×8 current sources.
FIG. 4 illustrates an exemplary current source layout in accordance with the present invention.
Figure 5:
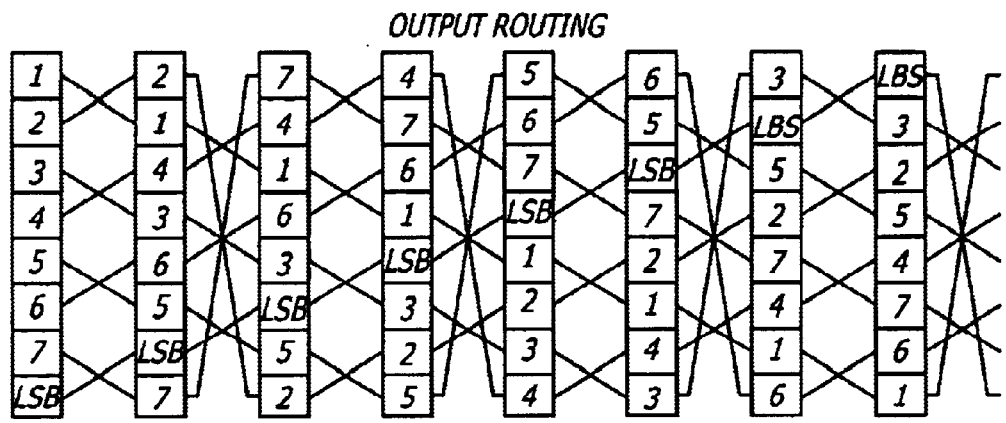
FIG. 5 is an illustration showing that in accordance with the present invention, every second current source output is routed in an opposite diagonal direction.

An exemplary layout in accordance with the present invention, specifically an 8×8 array of current sources, may be seen in FIG. 4. In this method, every second current source output is routed in an opposite direction, as illustrated in FIG. 5. While the least significant bits (LSBs) could be in a row or column, preferably the LSBs are arranged along a diagonal in the array, such that their sum is immune to horizontal and vertical process gradients. The routing capacitance matching network on the right side of FIG. 5 is included for the sake of completeness.

Figure 6:
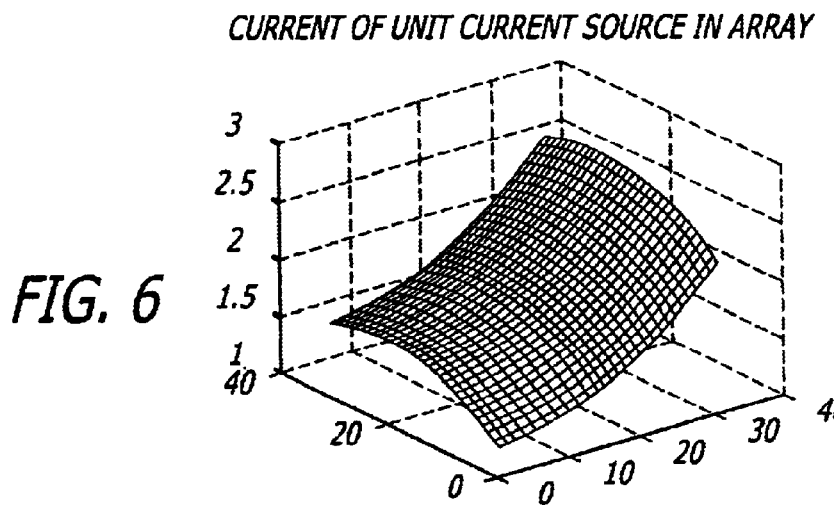
FIG. 6 is an illustration showing the large horizontal and vertical first and second order gradients that were introduced to a current source array of the present invention in a numerical simulation.
Figure 7:
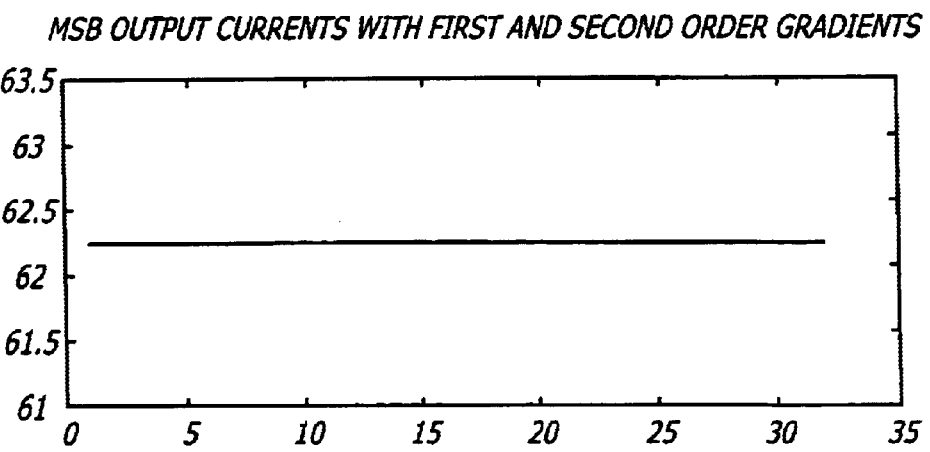
FIG. 7 is a graph showing that the first and second order gradients are perfectly canceled using a current source array in accordance with the present invention.
Figure 8:
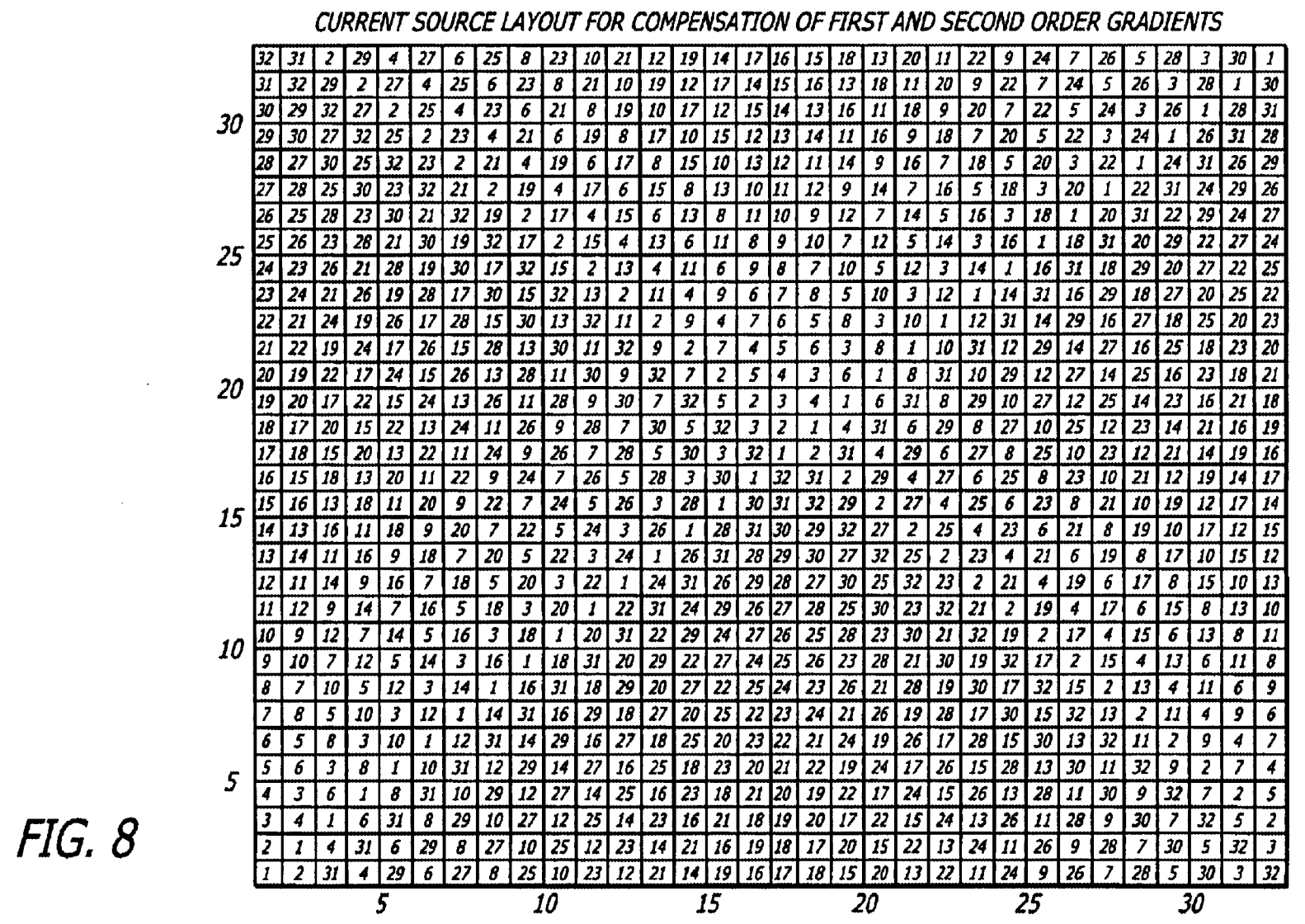

The immunity to process gradients was simulated using a numerical simulator for a 32×32 array—which would be the case for a DAC with 5 segmented bits. Large horizontal and vertical first and second order gradients were introduced as shown in FIG. 6. The actual layout of the current sources used in the simulation is shown in FIG. 8. As may be seen in FIG. 7, the first and second order gradients are perfectly canceled. Also, as can be seen from FIG. 8, every current is available at the top and bottom of the array, although in a randomized order.

Thus a DAC current source layout for a thermometer coded DAC has been provided. Simulations show that the layout perfectly compensates first and second order process gradients in both horizontal and vertical directions and has a low capacitance output interconnect scheme allowing accurate matching of output capacitances for all current sources. It is suggested that the thermometer coded LSBs are integrated along a diagonal in the array. In that way, their total output can be well matched to the outputs of the MSBs. The outputs of the array are available at all four sides of the array, allowing simple connection to current switches and trim current sources. Preferably, though not necessarily, the number of rows of current sources will equal the number of current sources in each row (the number of columns), with both being $2^N$, where N may be 2 or more, though more typically may be at least 3. The LSB current sources will preferably be $2^N$ smaller than the MSB current sources.

The advantages of the present invention layout scheme are related to removal of systematic nonlinearity errors in the DAC. This allows achievement of excellent static linearity without having to trim or calibrate the DAC. If trimming or calibration is used, the scheme allows reduction of the trim range/calibration range. A reduced trim range results in simplified hardware. A reduced calibration range results in less calibration noise when background calibration is used—hence improved signal to noise ratio.

While certain preferred embodiments of the present invention have been disclosed herein, it will be obvious to those skilled in the art that various changes in form and detail may be made therein without departing from the spirit and scope of the invention.

What is claimed is:

1. A current source array comprising:

$M^2$ current sources arranged in an array having an even number of columns 1 through M and an equal number of rows 1 through M;

the outputs of the current sources in even numbered rows of the first column each being connected to the output of a current source in each of the other columns located along a first diagonal through the array from the respective current source in the first column; and, the outputs of the current sources in odd numbered rows of the first column each being connected to the output of a current source in each of the other columns located along a second diagonal through the array from the respective current source in the first column, the second diagonals being in an opposite diagonal direction from the first diagonals.

2. The current source array of claim 1 wherein M is equal to $2^N$, where N is at least 2.

3. The current source array of claim 1 wherein M is equal to $2^N$, where N is 3.

4. The current source array of claim 1 wherein M is equal to $2^N$, where N is 4.

5. The current source array of claim 1 wherein M is equal to $2^N$, where N is 5.

6. The current source array of claim 1 wherein the current sources in one major diagonal running across the array between two current sources at opposite corners of the array each have nominal relative current of 1, and the current sources in each other of the first and second diagonals have a relative current of M.

7. A current source array comprising, in a thermometer coded current steering digital to analog converter:

$M^2$ current sources arranged in an array having an even number of columns 1 through M and an equal number of rows 1 through M;

the outputs of the current sources in even numbered rows of the first column each being connected to the output of a current source in each of the other columns located along a first diagonal through the array from the respective current source in the first column; and, the outputs of the current sources in odd numbered rows of the first column each being connected to the output of a current source in each of the other columns located along a second diagonal through the array from the respective current source in the first column, the second diagonals being in an opposite diagonal direction from the first diagonals.

8. The current source array of claim 7 wherein M is equal to $2^N$, where N is at least 2.

9. The current source array of claim 7 wherein M is equal to $2^N$, where N is 3.

10. The current source array of claim 7 wherein M is equal to $2^N$, where N is 4.

11. The current source array of claim 7 wherein M is equal to $2^N$, where N is 5.

12. The current source array of claim 7 wherein the current sources in one major diagonal running across the array between two current sources at opposite corners of the array each have nominal relative current of 1, and the current sources in each other plurality of the first and second diagonals have a relative current of M.

13. A current source array comprising:

a plurality of current sources arranged in an array of columns and rows;

the outputs of the current sources in even rows of the first column each being connected to the output of a current source in each of the other columns located along a first diagonal through the array from the respective current source in the first column; and, the outputs of the current sources in odd rows of the first column each being connected to the output of a current source in each of the other columns located along a second diagonal through the array from the respective current source in the first column, the second diagonals being in an opposite diagonal direction from the first diagonals.

14. The current source array of claim 13 wherein the array is square, and the current sources in one major diagonal running across the array between two current sources at opposite corners of the array each have nominal relative current of 1, and the current sources in each other plurality of the first and second diagonals have a relative current of M.

* * * * *